United States Patent [19]

Dhong et al.

[11] Patent Number: 4,816,706
[45] Date of Patent: Mar. 28, 1989

[54] SENSE AMPLIFIER WITH IMPROVED BITLINE PRECHARGING FOR DYNAMIC RANDOM ACCESS MEMORY

[75] Inventors: Sang H. Dhong, Mahopac; Nicky C. C. Lu, Yorktown Heights, both of N.Y.

[73] Assignee: International Business Machines Corporation, Armonk, N.Y.

[21] Appl. No.: 95,061

[22] Filed: Sep. 10, 1987

[51] Int. Cl.$^4$ ................... H03K 5/24; H03K 19/017; H03K 17/04; G11C 7/06
[52] U.S. Cl. ................... 307/530; 307/279; 307/355; 307/603; 365/196; 365/205; 365/208; 365/154
[58] Field of Search ............ 307/530, 279, 355, 475, 307/269, 603; 365/189, 191, 195, 196, 203, 207, 208, 154, 233, 205

[56] References Cited

U.S. PATENT DOCUMENTS

| | | | |
|---|---|---|---|
| 3,560,765 | 2/1971 | Kubinec | 307/246 |
| 3,648,071 | 3/1972 | Mrazek | 307/237 |
| 3,671,772 | 6/1972 | Henle | 307/291 |
| 3,789,315 | 1/1974 | Heller et al. | 330/35 |
| 3,879,621 | 4/1975 | Cavaliere et al. | 307/279 |
| 3,949,381 | 4/1976 | Dennard et al. | 340/173 |
| 4,053,873 | 10/1977 | Freeman et al. | 340/173 |
| 4,069,474 | 1/1978 | Boettcher et al. | 365/205 |
| 4,169,233 | 9/1979 | Haraszti | 307/279 |
| 4,236,231 | 11/1980 | Taylor | 365/163 |
| 4,247,791 | 1/1981 | Rovell | 365/190 |
| 4,262,341 | 4/1981 | Kawasaki et al. | 365/205 |
| 4,354,257 | 10/1982 | Varshney et al. | 365/219 |
| 4,375,600 | 3/1983 | Wu | 307/530 |
| 4,421,996 | 12/1983 | Chuang et al. | 307/530 |
| 4,551,641 | 11/1985 | Pelley, III | 307/530 |
| 4,608,670 | 8/1986 | Duvvury et al. | 365/205 |
| 4,627,033 | 12/1986 | Hyslop et al. | 365/205 |
| 4,694,205 | 9/1987 | Shu et al. | 307/530 |

Primary Examiner—Stanley D. Miller
Assistant Examiner—David R. Bertelson
Attorney, Agent, or Firm—John J. Goodwin

[57] ABSTRACT

A novel sense amplifier and decoupling device structure for integrated circuit memories wherein an embodiment of a cross-coupled sense amplifier includes two PMOS devices, the gates of which devices are grounded and clamp the downward voltage swing of the memory bitlines to the absolute value of the threshold voltage (VTP) of the grounded-gate PMOS devices in the sense amplifier. This limited voltage swing does not affect charge storage of storage capacitors because the absolute value of the threshold voltage (VT) of the cell transfer gate device is larger. Precharging the bitlines is achieved by equalizing the two bitlines, each charged to VDD and |VTP|, respectively. One node of the sense amplifier retains a full VDD swing and is conveniently connected to the DATA bus. The sense amplifier bitline swing is limited to a swing of VDD−|VTP| and saves power without adversely affecting charge storage and the precharging level

$$\left( \frac{VDD + |VTP|}{2} \right)$$

and improves the signal development time during sensing.

9 Claims, 6 Drawing Sheets

SENSE AMPLIFIER WITH IMPROVED BITLINE PRECHARGING FOR DYNAMIC RANDOM ACCESS MEMORY

BACKGROUND OF THE INVENTION

1. Field of the Invention

The present invention relates generally to sense amplifiers, and more particularly to complementary metal-oxide-silicon field effect transistor (CMOS-FET) sense amplifiers for readout of dynamic random access memory (DRAM) integrated circuit structures.

2. Background Art

The prior art contains many references describing various memory-array sense amplifiers using complementary metal oxide semiconductor devices such as field effect transistors (CMOS-FETs).

Examples of such references are provided in the following patents.

U.S. Pat. No. 4,169,233 issued Sept. 25, 1979 to Haraszti, entitled High Performance CMOS Amplifier, describes a sense amplifier circuit fabricated from complementary metal oxide semiconductor field effect transistors (CMOS-FETs) for applications in a radiation hardened environment. The sense amplifier is characterized by high sensitivity, high gain, good noise immunity, low power dissipation, fast operation, relatively small geometrical size, and good stabilization for temperature and supply effects while providing self-compensation for non-uniformities of electrical parameters which may occur as the result of MOS device processing or exposure to a nuclear radiation event. The sense amplifier circuit of FIG. 6 of the patent includes added transistors Q27 and Q29, but for purposes distinct from the present invention.

U.S. Pat. No. 4,375,600 issued Mar. 1, 1983 to Wu, entitled Sense Amplifier For Memory Array, describes a memory-array sense amplifier that includes a grounded-gate depletion-mode FET connected between a bitline and a sense node. Another FET connects a supply voltage VDD to the sense node when turned on by a clock phase signal. Further FETs form a latch circuit.

U.S. Pat. No. 4,262,341 issued Apr. 14, 1981 to Mogi et al, entitled Memory Circuit, relates to the addition of a capacitor circuit for augmenting the voltages at predetermined points in a sense amplifying circuit, in order to ensure a satisfactory refreshing of memory cells, since, if the potentials at the connecting points between a sense amplifying circuit and bitlines fall below a predetermined value when the sense amplifying circuit is caused to operate, it is difficult to achieve a complete refreshing of the memory cells. Transistors Q1 and Q2 can disconnect the bitlines from being discharged during development of sensed value in transistors Q3 and Q4.

U.S. Pat. No. 4,069,474 issued Jan. 17, 1978 to Boettcher et al, entitld MOS Random Acces Memory Having an Improved Sensing Circuit, discloses a memory circuit wherein first and second bitline portions, each having a plurality of memory cells coupled thereto are provided for reading and writing electrical potentials into and out of the coupled memory cells. A bistable flip-flop type sensing amplifier is coupled between the first and second bit portion for sensing the voltage difference therebetween and for latching into one of the two states in response to sensing either a "0" or "1" accessed to one of the bitline portions from an addressed memory cell to be read out of the memory.

In U.S. Pat. No. 4,236,231 issued Nov. 25, 1980 to Taylor and entitled Programmable Threshold Switchable Resistive Memory Cell Array, a memory-array is described wherein each memory cell includes a pair of threshold resistive elements which switch from a high to low resistance state when a potential above their respective programmable thresholds is applied. A binary value is stored by creating a threshold difference between the two resistive elements using two different value current sources. The binary value stored is read by applying a ramp potential and determining which threshold resistive element switched states first using a sense latch.

U.S. Pat. No. 4,247,791 issued Jan. 27, 1981 to Rovell, entitled CMOS Memory Sense Amplifier, discloses a complementary metal oxide semiconductor (CMOS) field effect transistor (FET) memory sense amplifier to detect a relatively small differential voltage that is superimposed on a relatively large common mode precharge signal. The sense amplifier is implemented so as to provide latched output signals after a short time delay and in response to sensed input signals that are supplied via a pair of data bus lines.

U.S. Pat. No. 4,354,257 issued Oct. 12, 1982 to Varshney et al, entitled Sense Amplifier for CCD Memory, describes a snese amplifier for use with a charge coupled device in which capacitive coupled charge is employed with a flip-flop circuit to accelerate sense and readout. Operation of the amplifier is effected with two external clocks and two internally generated clocks.

U.S. Pat. No. 4,421,996 issued Dec. 20, 1983 to Chuang et al, entitled Sense Amplification Scheme for Random Access Memory, describes a source-clocked type of cross-coupled latch sense amplifier of a dynamic random access memory device including a sense clock that employs multiple extended dummy memory cells to provide reference timing which tracks time constants of word line, cell transfer gate, cell capacitor,and bitline, and the sense clock is further compensated over large variations of fabrication process parameters and operating conditions. The trigger and slave clock circuit are chained in series to control the timing sequence of a plurality of clocked output signals. The clocked output signals are selectively amplified and summed in parallel to generate current with an intended dynamic characteristic. The current so generated is applied to the common source electrodes of the cross-coupled latch.

In U.S. Pat. No. 3,949,381 issued Apr. 6, 1976 to Dennard et al, entitled Differential Charge Transfer Sense Amplifier, a differential charge transfer amplifier, which functions as a sensing and regenerating circuit responsive to binary information represented by the level of charge in a stored charge memory cell is disclosed.

U.S. Pat. No. 3,879,621 issued Apr. 18, 1973 to Cavaliere et al, entitled Sense Amplifier, discloses an FET sense amplifier for converting a double rail differential memory output signal to a full logic output signal, the amplifier comprising first and second pairs of FETs coupled together at a pair of common nodes. In one embodiment, first and second field effect transistors of the same conductive type are connected to respective ones of the nodes. A third field effect transistor of a second conductive type is connected to one of the pairs of FETs, the first, second and third field effect transistors are interconnected so that when the first and second transistors conduct the third transistor is cut off, and when the first and second transistors are cut off, the third transistor conducts.

U.S. Pat. No. 3,671,772 issued June 20, 1972 to Henle, entitled Difference Amplifier, disposes a difference amplifier used as a sense amplifier for stored binary data being read from a computer memory. The amplifier includes a pair of cross-coupled transistors, a power source providing an operating voltage for said transistors, and means for intermittently applying said power source to the cross-coupled transistors. Selective application means apply each of the pair of voltage signals to be differentiated from each other to a respective one of the pair of cross-couplings, i.e., the pair of cross-connected regions in the transistors. In the case of reading from binary storage, the voltage signals are applied from the pair of sense lines from the memory storage. The signals are applied during a period when the voltage source is not being applied and, consequently, both of the paired transistors are in the non-conductive state. The signals establish a stored charge in each of the transistors; the difference between these charges will determine which of the transistors assumes the conductive state when the power is subsequently applied.

U.S. Pat. No. 3,648,071 issued Mar. 7, 1972 to Mrazek, entitled High-Speed MOS Sense Amplifier, relates to an improved sense amplifier comprised of an all FET amplifying circuit having means for limiting the voltage swing of the read potential applied thereby to an integrated circuit memory array in sensing the stored "1" and "0" memory states. The amplifier includes upper and lower output level-limiting circuits which detect predetermined signal levels in the output signal of the amplifier and cause the impedences at the input of the amplifier to be adjusted to limit the output signal swing of the amplifier to within the predetermined signal leads. In so doing, the memory read potential is also constrained to swing within certain predetermined limits.

U.S. Pat. No. 3,560,765 issued Feb. 2, 1971 to Kubinec, entitled High Speed MOS Read-Only Memory, describes a sense-amplifier for use with a read-only memory apparatus and having menas for limiting to less than six volts, the voltage to which the memory elements are subjected. An all FET amplifier structure is provided having an input stage which clamps the output voltage of the memory device to a predetermined potential and presents the output of the memory from causing this potential to swing more than a predetermined value when a storage element is gated ON.

U.S. Pat. No. 4,053,873 issued Oct. 11, 1977 to Freeman et al, entitled Self-Isolating Cross-Coupled Sense Amplifier Latch Circuit, discloses a self-isolating cross-coupled sense amplifier latch circuit having five enhancement mode field effect transistor devices and two depletion mode field effect transistor devices. The first and second field effect transistors form a cross-coupled pair with true and complement outputs being available at the cross-coupled nodes. A third field effect transistor is connected to a common connection between the source electrodes of the cross-coupled pair and is used to establish a race condition after a small difference in potential has been applied to the aforementioned output nodes. A pair of depletion mode devices are connected as diodes between a positive potential (VH) and each of the output nodes, respectively. Each of the output nodes is connected to a respective bitline of a column of memory cells through enhancement mode field effect transistors connected as third and fourth unidirectionally conducting devices.

U.S. Pat. No. 3,789,312 issued Jan. 29, 1974 to Heller et al, entitled Threshold Independent Linear Amplifier, describes a system wherein low level pulses in the order of 100 millivolts or less can be detected and amplified regardless of variations in the voltage required to turn on the active device used in the amplifier. This is achieved by coupling an active device between a capacitor and a capacitively loaded output line, charging the output line to a reference voltage, applying a level setting voltage to the device to turn on the device; charging the capacitor to a voltage substantially equivalent to the level setting voltage to turn off the device while maintaining it such that any input signal superimposed on the level setting voltage will cause the device to again turn on and discharge the capacitively loaded output line thereby amplifying and inverting the superimposed input signal. The invention is particularly useful for sensing random access integrated semiconductor memories.

SUMMARY OF THE INVENTION

An object of the present invention is to provide a sense amplifier, including cross-coupled devices, for integrated circuit memories which provides improved sensing speed without increased power consumption and unsymmetrical bitline voltage swing. The sense amplifier also includes a novel decoupling structure to provide improved restoring and writing time. Unique structural features of the improved sense amplifier include the provision of grounded-gate PMOS devices for the cross-coupled sense amplifier for voltage clamping and/or a decoupling structure incorporating an NMOS device having gate and drain elements connected together in parallel with a grounded-gate PMOS device.

DESCRIPTION OF THE PREFERRED EMBODIMENTS

In a dynamic ram access memory (DRAM), bitlines are precharged to a certain level before sensing starts. The optimum precharge voltage level in each situation depends on the design and technology used for the specific DRAM employed. In presenting employed technology using p-array devices in an n-well, precharging the bitlines higher than ½ VDD improves the sensing speed, but the increased power consumption and the resulting unsymmetrical bitline voltage swing are major drawbacks.

Figure 1:
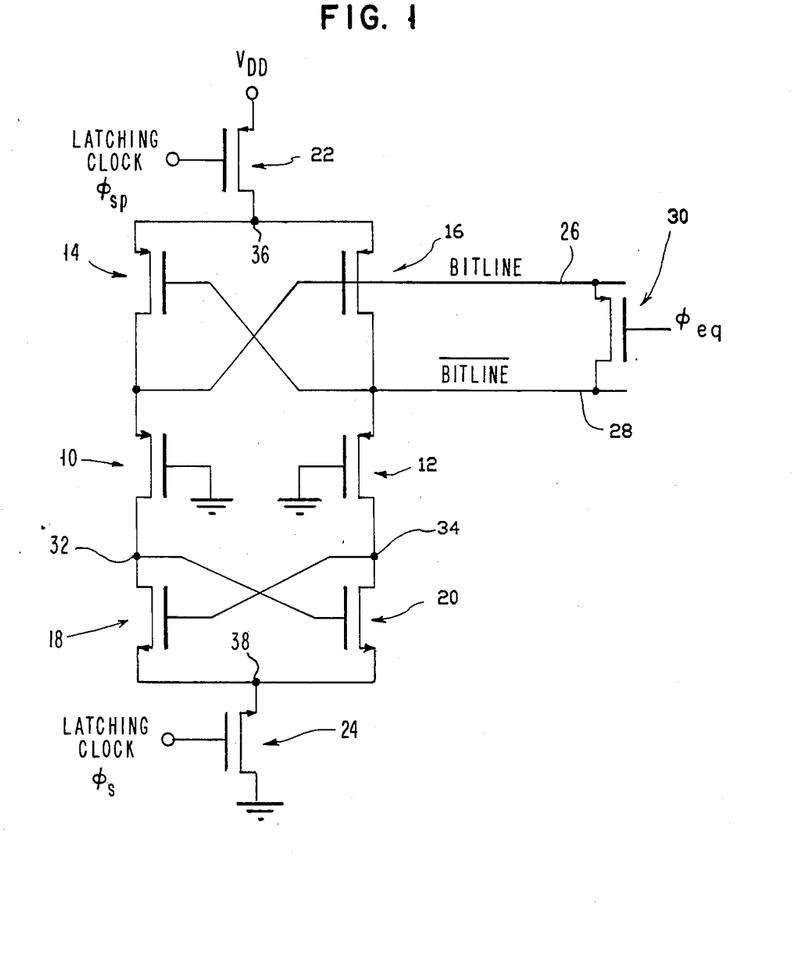
FIG. 1 is a schematic circuit diagram of one embodiment of a sense amplifier according to the principles of the present invention.

In the present invention, a novel sense amplifier is provided which solves these drawbacks with an improved sensing speed. In an embodiment of the sense amplifier of the present invention illustrated in FIG. 1, two PMOS devices 10 and 12 are added in a conventional cross-coupled sense amplifier which includes cross-coupled PMOS devices 14, 16 and cross-coupled NMOS devices 18, 20. The sense amplifier node 36 is connected to the power supply VDD via PMOS latching device 22 and node 38 is connected to reference potential (ground) via NMOS latching device 24. Latching clocks $\phi_s$ and $\phi_{sp}$ are applied to devices 24 and 22, respectively. The potential on bitline 26 and $\overline{\text{bitline}}$ 28 are equalized to the same value by turning on an equalization device 30 through an equalization clock $\phi_{eq}$. The gates of devices 10 and 12 are connected to reference potential (ground) which causes clamping the downward voltage swing of the bitlines to the absolute value of the threshold voltage (VTP) of the grounded-gate PMOS devices 10 and 12 which is approximately 1 volt in a typical 0.7 μm Complementary-Metal-Oxide-Silicon (CMOS) technology. This limited voltage swing does not affect the amount of charge stored in the storage capacitor of the cell, because the absolute value of the threshold voltage (VT) of a transfer gate is designed to be higher, for example, around 1.2 volts. One way of achieving this is to apply an n-well bias higher than VDD to the n-well where the transfer devices are located within. By doing so, the transfer device threshold voltage is higher than that of devices 10 and 12 because the n-well in which the devices 10 and 12 are in has a bias of VDD. Precharging the bitlines to a potential of $$\left(\frac{VDD + |VTP|}{2}\right)$$

is achieved by equalizing the two bitlines 26 and 28, each charged to VDD and $|VTP|$, respectively. With a VDD of three volts, the bitlines are precharged to 2 volts in the worse case analysis. The nodes 32 and 34 of the sense amplifier still retain a full VDD swing and can conveniently be connected to the DATA bus. The advantages of the sense amplifier, shown in FIG. 1, are that the bitline voltages swing is limited to a swing of VDD to $|VTP|$ and that it saves power without adversely affecting charge storage. The precharging level is $$\frac{VDD + |VTP|}{2}$$

(approximately 2V) and improves the signal development time during sensing. Also, the voltage swing of the bitlines is symmetrical about the precharge level and helps noise suppression, and the PMOS devices 10 and 12 with grounded gates decouple the NMOS devices 18 and 20 and their associated capacitances and improve sensing sensitivity.

The present invention is not limited to the embodiment of the sense amplifier shown in FIG. 1. Other embodiments of the invention are illustrated in FIGS. 2, 3, 4, and 5. The PMOS devices and NMOS devices which are functionally equivalent to those of FIG. 1 are given the same reference numbers in FIGS. 2, 3, 4 and 5.

Figure 2:
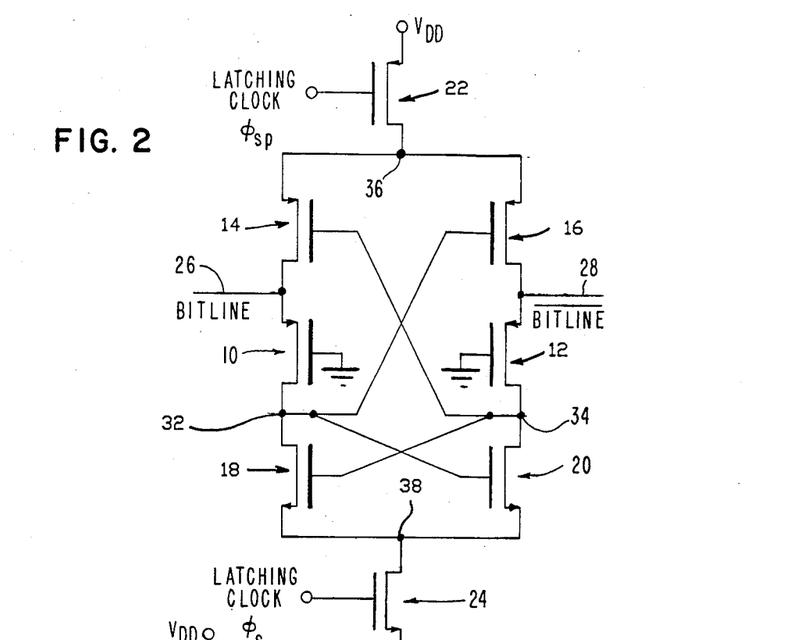
FIGS. 2, 3, 4 and 5 illustrate schematic alternate embodiments of sense amplifiers according to the principles of the present invention.
Figure 3:
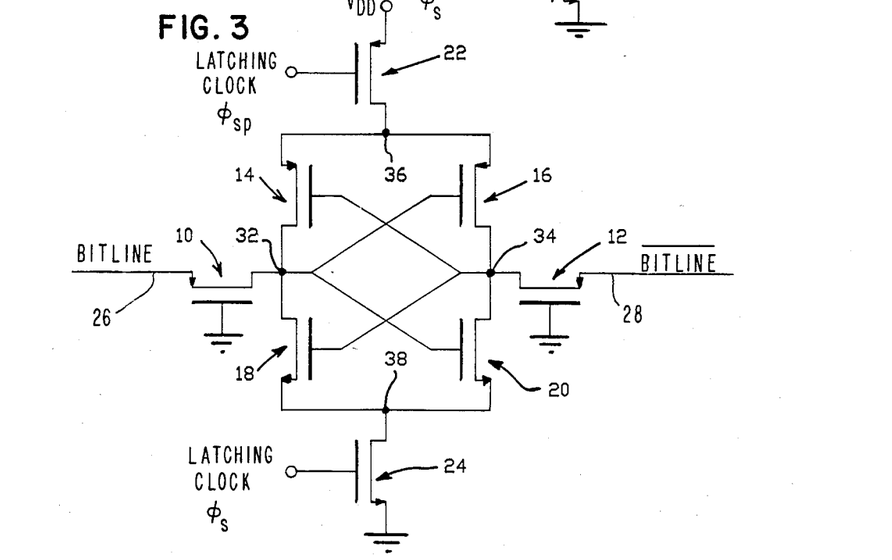
Figure 4:
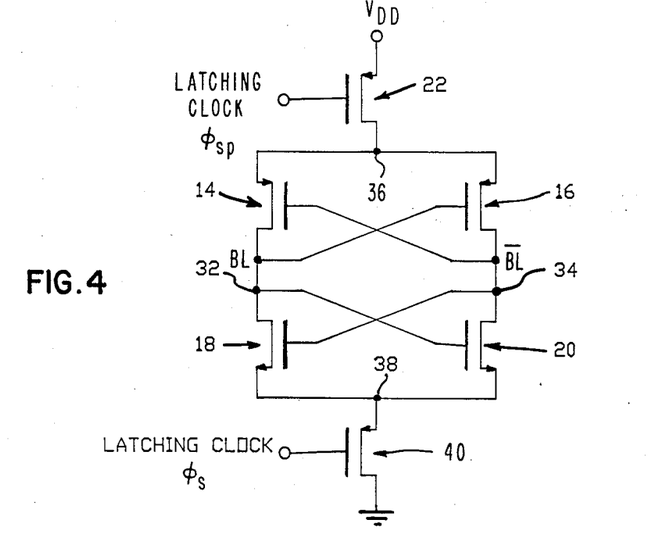
Figure 5:
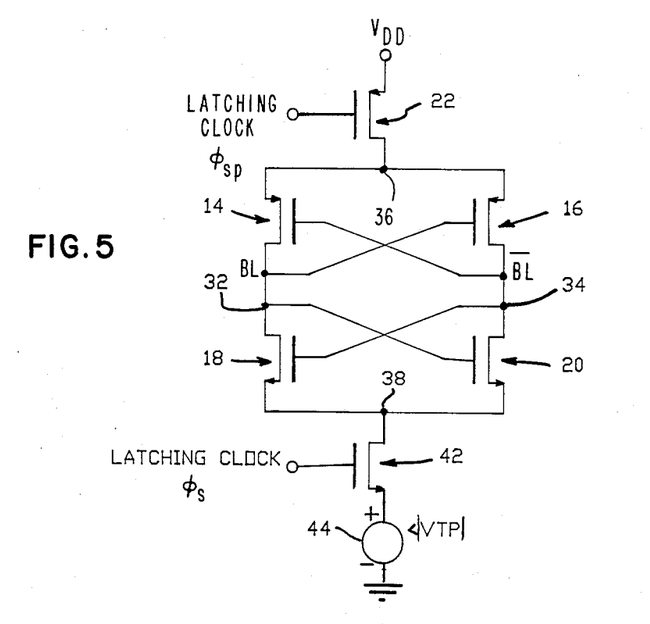

In the embodiments of FIGS. 2-5 as well as the embodiment of FIG. 1, the node 36 is connected to a PMOS latching device 22. The node 38 in FIGS. 2 and 3 is connected to an NMOS latching device 24. Nodes 38 of FIGS. 4 and 5 are connected to devices 40 and 42 respectively which are activated by a latching clock signal. In FIGS. 4 and 5, nodes BL and $\overline{\text{BL}}$ are connected to a bitline and its complement during sensing. Bit switches are connected to nodes 32 and 34 for reading or writing data between the sense amplifiers and input/output lines. The embodiment in FIG. 2 is obtained from that of FIG. 1 by connecting the gates of PMOS devices 14 and 16 to nodes 32 and 34. In the embodiment of FIG. 3, the grounded-gate PMOS devices 10 and 12 of FIG. 1 are repositioned and are put in series between nodes 32 and bitline 26 and between node 34 and bitline 28. In FIGS. 4 and 5, the latching devices 40 (FIG. 4) and 42 (FIG. 5) connected to the node 38 are different than latching device 24 shown in FIGS. 1, 2 and 3, respectively. The PMOS latching device 40 used in the embodiment of FIG. 4 in lieu of a conventional NMOS latching device 24 limits the voltage swing of the node 38 only to $|VT|$ (absolute value of the threshold voltage) of the PMOS device 40 and consequently limits bitline swing to the VT of the PMOS device 40. In the embodiments of FIG. 5, a voltage source 44 is added in series with the NMOS latching device 42 and limits the lower swing of the node 38 to the output voltage of the voltage source 44. The voltage source 44 is of conventional design with its output less than the $|VT|$ of array devices.

The present invention also provides a unique CMOS decoupling device structure for combination with the $$\frac{VDD + |VT|}{2}$$

sensing with limited bitline swing as embodied in the sense amplifier devices of FIGS. 1-5. The CMOS decoupling device structure of the present invention improves the write speed of $$\frac{VDD + |VT|}{2}$$

sensing and results in a write speed comparable to that of ½ VDD sensing. The CMOS decoupling device structure of the present invention is applicable to high-performance DRAMS.

For $$\frac{VDD + |VT|}{2}$$

sensing with limited bitline swing as discussed relative to FIGS. 1-5 hereinabove, the grounded-gate PMOS devices 10 and 12 provide the decoupling of the NMOS devices and their associated capcitances. Insertion of devices 10 and 12 in the bitlines or in the sense amplifiers limits the downward voltage swing of the bitline to the absolute value of the threshold voltage (VTP) of the grounded-gate PMOS devices 10,12. Precharging voltage of $$\frac{VDD + |VTP|}{2}$$

is obtained by equalizing two bitlines each of which is at |VTP| and VDD. In FIG. 1, the pull-up of the bitline to VDD is done by one of the two PMOS devices 14, 16 and can be as fast as ½ VDD sensing. The pull-down of the bitline to |VTP| is done by one of the two NMOS devices 18,20 through one of the grounded-gate PMOS devices 10,12. The grounded-gate PMOS device operates in a source-follower mode and hence, writing to a cell is slower than ½ VDD. In most of DRAM applications, this write time is not critical because a part of the write time can be hidden during the backend of DRAM cycle time. However, in a high-performance DRAM with a shorter cycle time for which the sense amplifier of the present invention is applicable, there are needs for improving the write speed especially for a static column writing mode.

Figure 6:
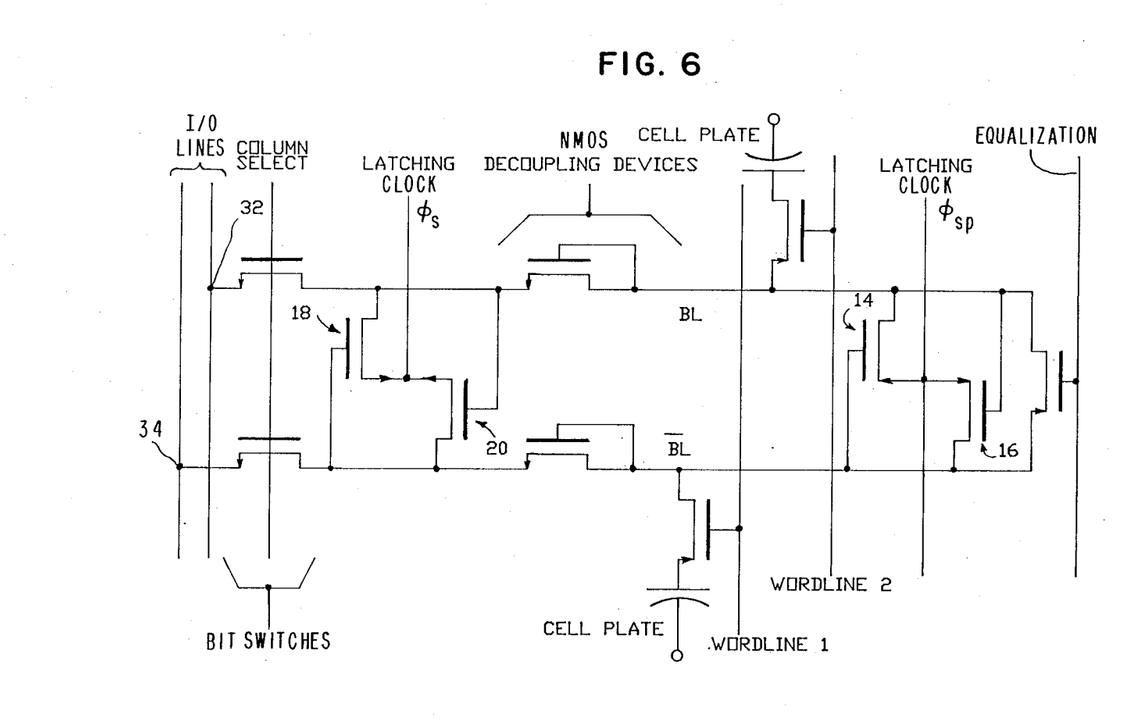
FIG. 6 shows a schematic circuit diagram of one embodiment of decoupling devices for a sense amplifier.

FIG. 6 shows a different embodiment of a decoupling technique using NMOS devices 50, 52 in a folded bitline layout with bit switches 54, 56 and ane equalization device 58. In this design, NMOS devices 50, 52 having their gates connected to the bitlines BL and $\overline{BL}$, respectively, replace the grounded-gate PMOS devices 10, 12 previously discussed. This decoupling device offers only a marginal improvement over the previous designs.

Figure 7:
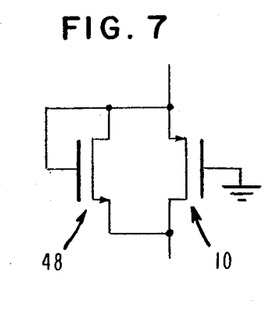
FIG. 7 illustrates a schematic circuit of an improved decoupling structure for sense amplifiers according to the principles of the present invention.
Figure 8:
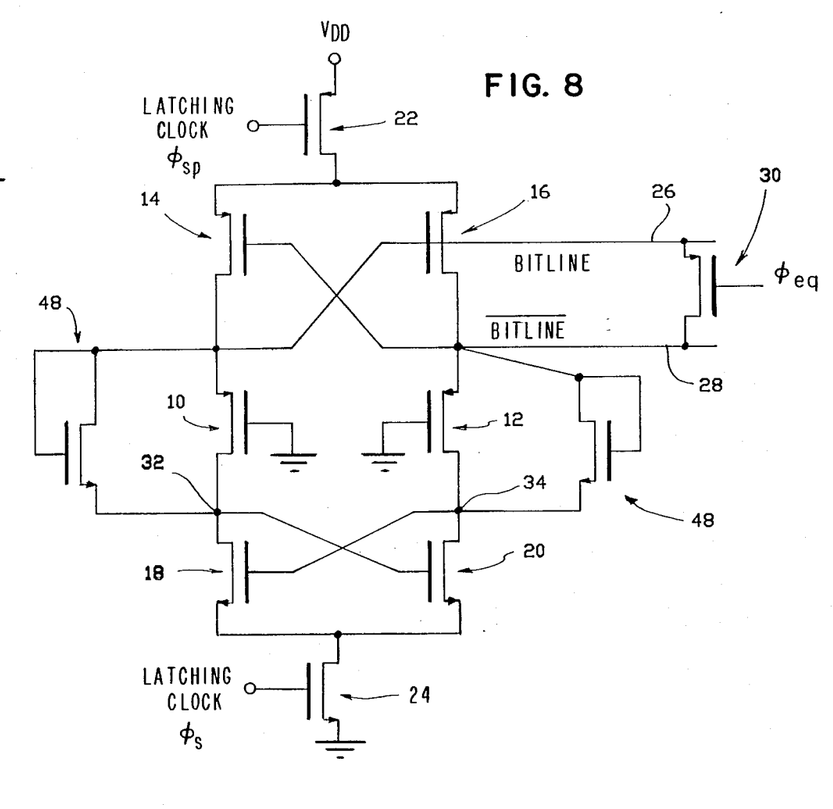
FIGS. 8 and 9 show schematic circuit diagrams of the decoupling structure of FIG. 7 incorporated into the sense amplifier embodiments of FIGS. 2 and 3, respectively.
Figure 9:
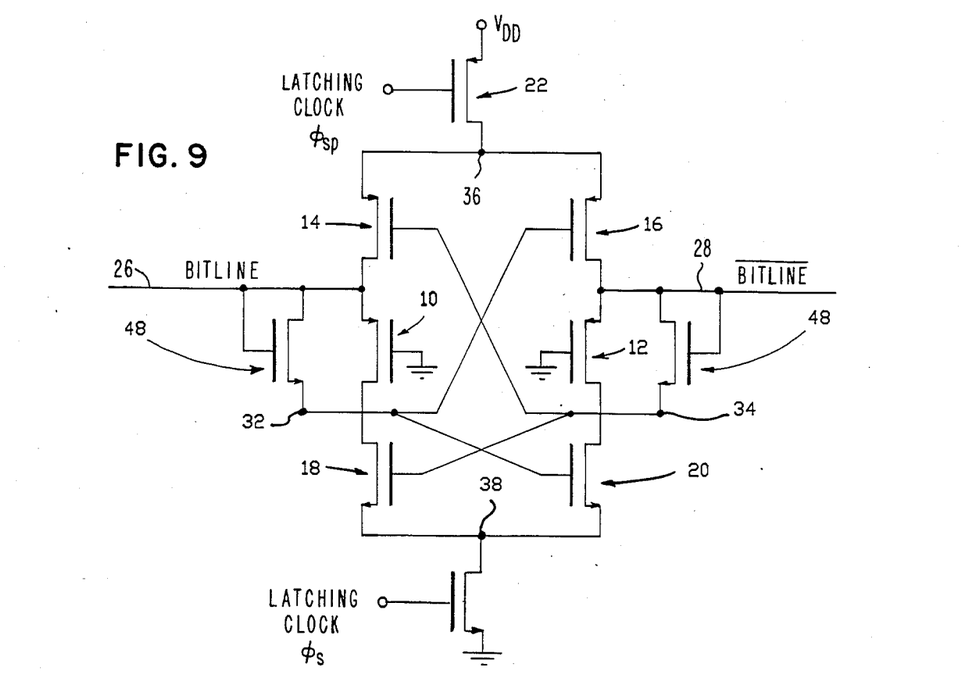
Figure 10:
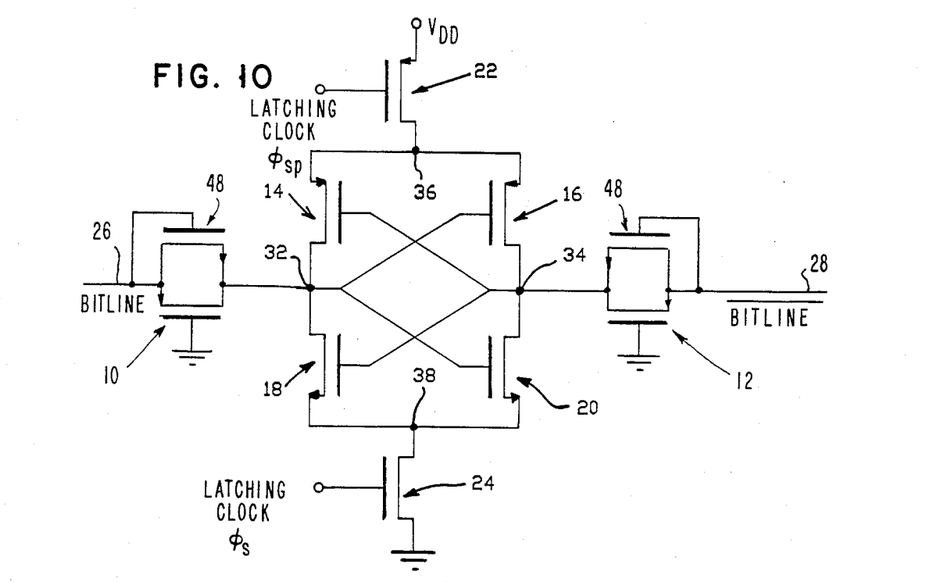

A new improved CMOS decoupling device is shown in FIG. 7. It is composed of a grounded-gate PMOS device such as devices 10 or 12 of the sense amplifiers of FIGS. 1, 2 and 3 in parallel with an NMOS device 48 whose gate is connected to its drain. For example, the decoupling device of FIG. 7 is inserted in the bitlines or in the sense amplifiers of FIGS. 1, 2 and 3 as shown in FIGS. 8, 9 and 10 respectively. With the new CMOS decoupling device, a write time approaching that of ½ VDD is achieved because the pull-down of the bitline is achieved through the NMOS pair 18, 20 and PMOS pair 14, 16 and is limited to the smaller threshold voltage of either NMOS or PMOS device. The bitline BL and $\overline{BL}$ is connected to the drain of the NMOS 48 and consequently the source-follower effect encountered with a grounded-gate PMOS device is eliminated.

A proper operation of the CMOS decoupling device requires that the bitline downward voltage swing should be less than the |VTP| of the transfer device in a cell. Otherwise, the cell suffers a loss in the "O" signal. When the sense amplifier latches, the source of the NMOS device 48 of the decoupling device goes to ground and its threshold voltage is not affected by the body effect and stays at its nominal value.

By designing |VTP| of the transfer device higher than the nominal threshold voltage of the NMOS device, the bitline is clamped below the |VTP| of the transfer device.

Thus, a new decoupling device in combination with a sense amplifier for $$\frac{VDD + |VTP|}{2}$$

sensing with limited bitline swing has also been described. Important features of the new decoupling device include an NMOS device with a gate electrode connected to the memory bitline which functions as a decoupling device for $$\frac{VDD + |VTP|}{2}$$

sensing with limited bitline swing, and an NMOS device whose gate and drain electrodes are connected together in parallel with a grounded-gate PMOS device which also functions as a CMOS decoupling device serving the same purpose. For a circuit with a CMOS decoupling device, the write time is significantly improved because of inclusion on an NMOS device approaching that of ½ VDD sensing. The downward bitline swing is limited to VTN, which is lower than |VTP| of the transfer device of the memory cell with no loss of the "0" signal.

Having thus described our invention what we claim as new, and desire to secure as Letters Patent is:

1. A sense amplifier structure for readout of dynamic random access memory integrated circuits comprising:
    a first latching device connected to a source of supply voltage,
    a first pair of first conductivity type cross-coupled field-effect transistors connected together between first and second nodes of at least one pair of connecting nodes and said first latching device,
    a second latching device connected to ground potential, a second pair of second conductivity cross-coupled field-effect transistors connected together between first and second nodes of said at least one pair of connecting nodes and said second latching device,
    a first bitline and a second complementary bitline for conducting bitline signals thereon of varying bitline voltage magnitudes, and voltage limiting means connected to said at least one pair of connecting nodes for limiting the magnitudes of said bitline voltage magnitudes,
    wherein said voltage limiting means includes
    a first voltage limiting transistor connected to a first node of said at least one pair of connecting nodes, said first voltage and limiting transistor having a gate electrode connected to said ground potential, and
    a second voltage limiting transistor connected to a second node of said at least one pair of connecting nodes, said second voltage limiting transistor having a gate electrode connected to said ground potential.

2. A sense amplifier structure according to claim 1 wherein said first and second bitlines are connected to said at least one pair of connecting nodes.

3. A sense amplifier structure according to claim 1 wherein said first and second voltage limiting transistors connected to said at least one pair of connecting nodes are first conductivity type transistors.

4. A sense amplifier according to claim 3 wherein said first bitline is connected to said first voltage limiting transistor connected to said first node of said at least one pair of connecting nodes, and wherein said second bitline is connected to said second voltage limiting transistor connected to said second node of said at least one pair of connecting nodes, and
    wherein said first and second bitlines conduct bitline voltage signals thereon having magnitudes of voltage variations limited by said first and second voltage limiting transistors.

5. A sense amplifier structure according to claim 1 including: said first pair of cross-coupled first conductivity type field-effect transistors connected together between a first pair of nodes and said first latching device,
   said second pair of cross-coupled second conductivity type field-effect transistors connected together between a second pair of nodes said second latching device, and
   wherein said first voltage limiting transistor includes source and drain electrodes connected between first ones of said nodes of said first and second pairs of nodes, and
   said second voltage lmiting transistor includes source and drain electrodes connected between second ones of said nodes of said first and second pairs of nodes.

6. A sense amplifier according to claim 5 further including a first bitline connected to said first node of said first pair of nodes and a second complementary bitline connected to said second node of said second node of said first pair of nodes.

7. A sense amplifier structure according to claim 6 further including a first decoupling structure connected to said source and drain electrodes of said first voltage limiting transistor, and a second decoupling structure connected to said source and drain electrodes of said second voltage limiting transistor.

8. A sense amplifier structure according to claim 1 wherein
   said first pair of cross-coupled first conductivity type field-effect transistors are connected together between a pair of nodes and said first latching device,
   a second pair of cross-coupled second conductivity type field-effect transistors connected are together between said pair of nodes and said second latching device,
   said first bitline is connected to a first node of said pair of nodes a second, complementary bitline is connected to a second node of said pair of nodes, and
   wherein said first voltage limiting transistor includes source and drain electrodes connected between said first node of said pair of nodes, and said first bitline, and
   wherein said voltage limiting second transistor includes source and drain electrodes connected between a second node of said pairs of nodes and said second complementary bitline.

9. A sense amplifier structure according to claim 8 further including a first decoupling structure connected to said source and drain electrodes of said first voltage limiting transistor and a second decoupling structure connected to said source and drain electrodes of said second voltage limiting transistor.

* * * * *